(12) United States Patent
McCain

(10) Patent No.: US 7,230,321 B2
(45) Date of Patent: Jun. 12, 2007

(54) INTEGRATED CIRCUIT PACKAGE WITH LAMINATED POWER CELL HAVING COPLANAR ELECTRODE

(76) Inventor: Joseph McCain, 3762 Dove Creek, Celina, TX (US) 75009

( * ) Notice: Subject to any disclaimer, the term of this patent is extended or adjusted under 35 U.S.C. 154(b) by 224 days.

(21) Appl. No.: 10/685,825

(22) Filed: Oct. 13, 2003

(65) Prior Publication Data

US 2005/0077604 A1   Apr. 14, 2005

(51) Int. Cl.
*H01L 23/495*   (2006.01)
*H01L 21/00*   (2006.01)
(52) U.S. Cl. .................. 257/666; 438/19; 438/111; 438/123
(58) Field of Classification Search ................ 257/666, 257/691, 929; 438/19
See application file for complete search history.

(56) References Cited

U.S. PATENT DOCUMENTS

| | | | |
|---|---|---|---|
| 4,024,420 A * | 5/1977 | Anthony et al. ............. 310/303 |
| 4,042,861 A * | 8/1977 | Yasuda et al. ............... 361/783 |
| 4,585,718 A * | 4/1986 | Uedaira et al. .............. 429/224 |
| 4,759,771 A | 7/1988 | Morra | |
| 4,971,868 A * | 11/1990 | Tucholski et al. ........... 429/174 |
| 5,008,776 A * | 4/1991 | Queyssac ..................... 361/728 |
| 5,089,877 A * | 2/1992 | Queyssac et al. ........... 257/666 |
| 5,124,782 A * | 6/1992 | Hundt et al. ................. 257/724 |
| 5,153,710 A * | 10/1992 | McCain ........................ 257/724 |
| 5,196,374 A * | 3/1993 | Hundt et al. .................. 29/827 |
| 5,294,829 A * | 3/1994 | Hundt ......................... 257/678 |
| 5,323,150 A * | 6/1994 | Tuttle .......................... 257/793 |
| 5,326,652 A | 7/1994 | Lake | |
| 5,338,625 A | 8/1994 | Bates et al. | |
| 5,403,782 A * | 4/1995 | Dixon et al. .................. 29/827 |
| 5,448,110 A | 9/1995 | Tuttle et al. | |
| 5,451,715 A * | 9/1995 | Hundt et al. ................ 174/52.4 |
| 5,475,259 A * | 12/1995 | Kasai et al. ................. 257/692 |
| 5,497,140 A | 3/1996 | Tuttle | |
| 5,498,903 A * | 3/1996 | Dixon et al. ................. 257/690 |
| 5,572,226 A | 11/1996 | Tuttle | |
| RE35,765 E * | 4/1998 | Tuttle .......................... 257/793 |
| 5,776,278 A | 7/1998 | Tuttle et al. | |
| 5,779,839 A | 7/1998 | Tuttle et al. | |
| 5,787,174 A | 7/1998 | Tuttle | |
| 5,864,182 A | 1/1999 | Matsuzaki | |
| 5,900,671 A | 5/1999 | Takahashi et al. | |
| 6,013,949 A | 1/2000 | Tuttle | |
| 6,045,652 A | 4/2000 | Tuttle et al. | |
| 6,160,307 A * | 12/2000 | Kweon ........................ 257/676 |

(Continued)

FOREIGN PATENT DOCUMENTS

EP   0348018 B1   12/1989

(Continued)

*Primary Examiner*—Carl Whitehead, Jr.
*Assistant Examiner*—J. M. Mitchell
(74) *Attorney, Agent, or Firm*—Haynes and Boone, LLP; Dave R. Hofman

(57) ABSTRACT

An electrode that includes an electrically conductive, substantially planar body having a first thickness and a junction area, wherein the junction area is configured to receive a solid state power cell having a second thickness. The electrode also includes an arcuate terminal electrically coupled to the body and configured to position a wire bond terminus at a perpendicular distance from the body, the distance being not substantially less than the sum of the first and second thicknesses.

10 Claims, 2 Drawing Sheets

U.S. PATENT DOCUMENTS

| | | |
|---|---|---|
| 6,218,049 B1 | 4/2001 | Bates et al. |
| 6,266,647 B1 | 7/2001 | Fernandez |
| 6,278,056 B1 | 8/2001 | Sugihara et al. |
| 6,325,294 B2 | 12/2001 | Tuttle et al. |
| 6,329,705 B1 * | 12/2001 | Ahmad ............... 257/666 |
| 6,346,343 B1 * | 2/2002 | Notten et al. ............. 429/60 |
| 6,465,129 B1 * | 10/2002 | Xu et al. ............... 429/224 |
| 6,731,512 B2 | 5/2004 | Nebrigic et al. |
| 2003/0201520 A1 * | 10/2003 | Knapp et al. ............ 257/666 |
| 2005/0026037 A1 * | 2/2005 | Riley et al. ............. 429/210 |

FOREIGN PATENT DOCUMENTS

| | | |
|---|---|---|
| EP | 0526063 A1 | 2/1993 |
| JP | 360007760 * | 1/1985 |
| JP | 404317364 * | 11/1992 |
| JP | 6-85162 * | 3/1994 |
| WO | 2001039252 | 5/2001 |
| WO | 200197300 | 12/2001 |
| WO | 2002103823 | 6/2002 |
| WO | 2002080291 | 10/2002 |
| WO | 2003103074 | 6/2003 |
| WO | 2003105255 | 6/2003 |
| WO | 2003085751 | 10/2003 |
| WO | 2003107458 | 12/2003 |
| WO | 2003107475 | 12/2003 |

\* cited by examiner

INTEGRATED CIRCUIT PACKAGE WITH LAMINATED POWER CELL HAVING COPLANAR ELECTRODE

BACKGROUND

The present disclosure relates generally to the field of integrated circuit packages and, more specifically, to an integrated circuit package including a laminated power cell with a coplanar electrode.

Integrated circuit packages are utilized to enclose, protect and isolate integrated circuits from potentially hazardous mechanical and environmental elements which may cause damage or destruction. The packages also provide a robust and rugged platform for operational needs of integrated circuits, including heat transfer, structural stability and electrical connections.

An integrated circuit package generally consists of one or more layers of electrically insulating material that encapsulates the integrated circuit. The backbone of the package is a lead frame, which includes a central support member and formable, flexible metal leads that extend radially from connecting areas around the periphery of the central support to facilitate electrical connections upon assembly with a printed circuit board assembly. The integrated circuit device is formed in a die that is coupled to the central support member.

Integrated circuit devices that are typically encapsulated in such packages may include high density memory array devices, logic devices, processing units, microcontrollers, communications controllers and associated input and output structures. Of course, nominal operation of these devices depends on a consistent power supply. Generally, highly integrated, multifunction devices contain sensing circuitry to determine when a power source achieves adequate voltage and current stability required for nominal operation. When voltage and current operating conditions become unfavorable, the integrated circuit slows operation to conserve energy. When a normally operating integrated circuit device is disconnected from a power source external to the integrated circuit package, internal selection circuitry of an on-chip or internal power source enables the device to continue operating as though external power remained available. Thus, the automatic sensing and switching operation between external and internal power sources keeps the integrated circuit device operating uninterrupted, with switching between the two power sources optimally being transparent.

Laminated power cells based on solid state battery technology are one type of power sources recently developed for use as a redundant, internal power supply for use with integrated circuit packages. As such power cell technology continues to develop, an on-going concern is the integration of the power cells into existing package designs while avoiding substantial redesign of existing packaging and associated circuitry. That is, it is desirable to incorporate laminated power cells into existing package designs without impacting the standardized physical sizes, shapes and electrical connections consistent with existing industry requirements.

However, while solid state battery technology continues to improve, the physical package assemblies of laminated power cells are restricted to separate anode and cathode contacts which, when assembled within an integrated circuit package, are not coplanar with existing lead frame assemblies. Consequently, employing laminated power cells with existing integrated circuit packaging mandates physically opposed electrode locations, rendering interconnection of the power cell and integrated circuit complex and labor intensive, which reduces product yield and reliability and increases unit costs.

Accordingly, what is needed in the art is an integrated circuit package that incorporates a laminated power cell and addresses the problems discussed above.

SUMMARY

The present disclosure relates to a new process and structure for an integrated circuit package incorporating an integrated circuit and a laminated power cell and including a coplanar electrode. In one embodiment, the electrode includes an electrically conductive, substantially planar body having a first thickness and a junction area, wherein the junction area is configured to receive a solid state power cell having a second thickness. The electrode also includes an arcuate terminal electrically coupled to the body and configured to position a wire bond terminus at a perpendicular distance from the body. Preferably, the distance is not substantially less than the sum of the first and second thicknesses.

In one embodiment, the electrode described above may be implemented in an integrated circuit package constructed according to aspects of the present disclosure. One such integrated circuit package includes a lead frame assembly having a central support member and a plurality of conductive leads radially disposed about the periphery of the central support member. An integrated circuit die having a plurality of bond pads is coupled to a first major surface of the central support member, and a plurality of first wire bonds each couple one of the bond pads and one of the conductive leads. A second wire bond having a first terminus is coupled to one of the bond pads. A power cell is coupled to a second major surface of the central support member. The body of the electrode is coupled to the power cell opposite the central support member, whereas the terminal is configured to position a second terminus of the second wire bond substantially coincident with the first surface of the central support member.

A method of manufacturing an integrated circuit package is also provided in the present disclosure. In one embodiment, the method includes providing a lead frame assembly that includes a central support member having opposing first and second major surfaces and a plurality of conductive leads radially disposed about the periphery of the central support member. An integrated circuit die is coupled to the first surface, the integrated circuit die having a plurality of bond pads. Ones of the bond pads are coupled to ones of the conductive leads via a plurality of first wire bonds, and a first terminus of a second wire bond is coupled to one of the bond pads. A power cell is coupled to the second surface of the central support member. An electrode having a planar body and a terminal coupled to the body is also provided, wherein the terminal is configured to position a second terminus of the second wire bond substantially coincident with the first surface. The body is coupled to the power cell opposite the die support, and the terminal is coupled to the second terminus.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

DETAILED DESCRIPTION

Figure 1:
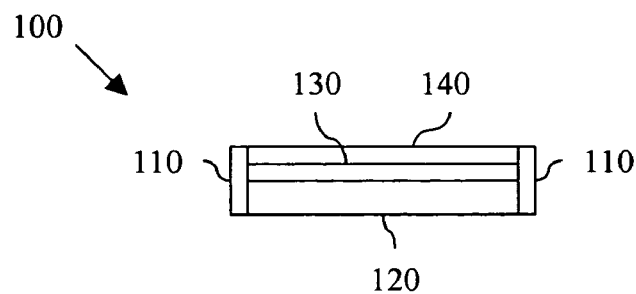
FIG. 1 is a sectional view of one embodiment of a laminated power cell constructed according to aspects of the present disclosure.

The present disclosure is related generally to the fabrication of integrated circuit packages and, more particularly, to an integrated circuit package including a laminated power cell and a coplanar electrode, as well as a method of manufacturing such an electrode and integrated circuit package. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Also, the present disclosure details an exemplary embodiment of a rechargeable, solid state polymer battery for providing operating power to a low-power computing, logic or memory device encapsulated within a surface mountable plastic leaded chip carrier (PLCC) package. However, it will be appreciated that the formed electrode and solid state battery combination disclosed herein may be used to provide power for other types of integrated circuit devices.

Referring to FIG. 1, illustrated is a sectional view of a laminated power cell 100 constructed according to aspects of the present disclosure. In one embodiment, the power cell 100 may be a solid polymer, rechargeable secondary cell, and may be fabricated according to conventional solid state battery processes. Thus, those skilled in the art will recognize that the particular embodiment of the power cell 100 provided herein is for exemplary purposes only, and that the present disclosure is not limited to any specific conventional or future-developed power cell.

In the embodiment shown in FIG. 1, the laminated power cell 100 includes a frame or carrier 110, which may be a four-sided, open-ended structure surrounding the laminated layers of the power cell 100. The frame 110 may substantially comprise a dielectric material, or may comprise conductive material (metal) with an electrically insulating lining isolating the laminated layers of the power cell 100 from the remainder of the frame 110.

The power cell 100 also includes a cathode 120. The cathode 120 may comprise dioxide, disulfide, pentoxide or other materials typically employed in the fabrication of solid state battery electrodes. The cathode 120 may also be impregnated with p-type or n-type impurities to enhance conductivity, possibly depending on the doping scheme employed in the fabrication of a semiconductor device to be packaged with the power cell 100.

A solid electrolyte 130 or other separator is located on the cathode 120. The solid electrolyte 130 may comprise manganese, titanium, vanadium or other materials typically employed in the fabrication of solid state battery electrolytes. In one embodiment, the solid electrolyte 130 may comprise lithium perchlorate ($LiClO_4$) mixed with polyvinylidene ($LiClO_4$-PVDF).

The power cell 100 also includes an anode 140 located on the solid electrolyte 130. The anode 140 may be a metal alloy film or foil that may be impregnated with lithium or lithium alloy impurities to enhance conductivity. The anode 140 may also be impregnated with p-type or n-type impurities to enhance conductivity, possibly depending on the doping scheme employed in the fabrication of a semiconductor device to be packaged with the power cell 100. In one embodiment, the cathode 120 may be doped with a first impurity type (e.g., n-type) while the anode 140 may be doped with a second, opposite impurity type (e.g., p-type). Of course, the present disclosure is not limited to any particular doping scheme of the power cell 100 or semiconductor device to be packaged with the power cell 100.

In one embodiment, the power cell 100 may employ a lithium manganese dioxide chemistry, which is readily available and understood by those skilled in the art. In other embodiments, the power cell 100 chemistry may be lithium titanium disulfide (Li—$TiSO_2$) or lithium vanadium pentoxide (Li—$V_2O_5$). Also, as discussed above, the cathode 120 and/or anode 140 may be doped with impurities, such as those typically employed in a semiconductor doping scheme. In that regard, the order in which the cathode 120, solid electrolyte 130 and anode 140 are fabricated may depend on the fabrication processes of a semiconductor device to be packaged with the power cell 100. For example, the cathode 120 may be associated with (or fabricated concurrently with) an n-type semiconductor device substrate and the anode 140 may be associated with a p-type semiconductor substrate. The power cell 100 may have a thickness ranging between about 500 microns and about 1000 microns.

The anode 140 may be formed by slicing a lithium foil ingot (possibly comprising battery grade, 99.8% pure lithium, or FMC-lithium) to approximately 40 microns in thickness. the anode 140 may also be alloyed with such metals as aluminum, manganese and/or copper. The solid electrolyte 130 may be formed, in one embodiment, by emulsifying a polymer matrix possibly in combination with a plasticizer. The polymer matrix may comprise polyacrylonitrile (PAN), polyvinyliden floride (PVdF) and/or polyvinyl sulfone (PVS), and the plasticizer may comprise dibutyl phthalate (DBP). The polymer matrix and plasticizer may be emulsified in acetonitrile at 60° C. in a reactor vessel equipped with a nitrogen inlet, a reflux condenser and a stirring mechanism. The resulting viscous solution may then be cast into a polymer substrate to yield a film thickness ranging between about 30 microns and about 100 microns. The cast polymer membrane film may then be dried in an oven, possibly at a temperature of about 80° C., to remove the acetonitrile casting agent. After being allowed to dry, the originally highly viscous membrane may be a translucent, flexible polymer membrane that also contains a high temperature plasticized structure for rigidity.

The polymer film may then be implanted. In one embodiment, an electrolyte solution possibly consisting of Ethylenecarbonate-EC, Propylyenecarbonate (PC), and Lithium Perchlorate (LiClO4) mixed in a ratio of approximately 52/41/7 by weight, respectively, may be prepared for implanting the polymer film to complete the solid electrolyte. For example, the electrolyte solution may be heated, possibly to a temperature of about 60° C., and the polymer film may be placed into the heated electrolyte solution, possibly for a period of up to 8 hours, to allow the electrolyte salt to link to the polymer structure. When the polymer film is removed from the electrolyte solution, it is cooled to room temperature, thereby allowing additional electrolyte and polymer cross linking. The resulting solid state electrolyte separator membrane may then be cut to a desirable width and length to complete the solid electrolyte 130.

A similar process may be employed to form the cathode 120. In one embodiment, however, the polymer film may have a thickness ranging between about 300 microns and about 750 microns. Possibly employing the same type of reactor agent vessel with stirring mechanism, the polymer emulsion with plasticizer agent may be mixed with an electrochemical grade of LiMn2O4 spinel (FMC-Lithium), a Super-P carbon such as Vulcan XC-72 (Cabot), in a ratio of approximately 55/42/3 by weight, respectively. The resulting polymer film may then be cut to a desirable width and length to form the cathode 120.

Figure 2:
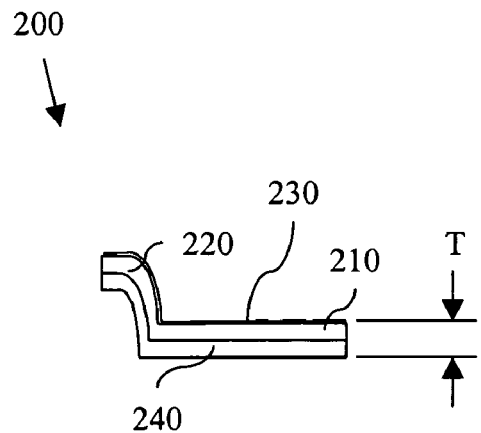
FIG. 2 is an elevation view of one embodiment of an electrode constructed according to aspects of the present disclosure.
Figure 3:
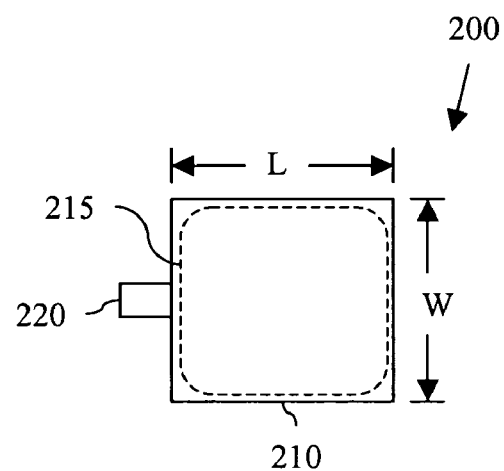
FIG. 3 is a plan view of the electrode shown in FIG. 2.

Referring to FIGS. 2 and 3 collectively, illustrated are plan and elevation views, respectively, of one embodiment of an electrode 200 constructed according to aspects of the present disclosure. The electrode 200 includes a substantially planar body 210 and a terminal 220. The body 210 includes a junction area 215 configured to receive a solid state power cell, such as the power cell 100 shown in FIG. 1. That is, the body 210 may have a shape that is substantially similar to the footprint of the power cell 100. In one embodiment, the body 210 may have a thickness T ranging between about 500 microns and about 1000 microns, a width W ranging between about 7,500 microns and about 10,000 microns and a length L ranging between about 7,500 microns and about 10,000 microns. However, the dimensions of the electrode body 210 may generally be similar to those of a central support member (also known as a die support or die paddle plate) of a lead frame assembly with which the electrode 200 may be packaged.

The terminal 220 may be integral to the body 210, such as in embodiments in which the electrode 200 is formed by press-forming a single sheet of material or by machining, casting or molding bulk material. However, the terminal 220 may also be formed as a discrete element that is subsequently coupled to the body 210, such as by welding or adhesive bonding. The terminal 220 may have an arcuate shape, such as shown in FIG. 2, in order to position a wire bond terminus at a desired location, as further described below with reference to FIG. 4. However, the terminal 220 may have shapes other than in the embodiment shown in FIG. 2 while still providing a connection point at a desired location according to aspects of the present disclosure.

The body 210 and terminal 220 may comprise tin-plated nickel, a copper-nickel alloy, an iron alloy, a tin-plated copper alloy or other electrically conductive materials. The body 210 and terminal 220 may also include a conductive coating 230 which may increase their electrical conductivity. The conductive coating, which may have a thickness of about 25.4 microns, may be a graphite based coating, such as Electrodag® EB-012 distributed by the Acheson Colloids Company of Port Huron, Mich. The conductive coating 230 may be applied by lamination or conventional or future-developed thin-film deposition processes, and may be cured by exposure to heat or air.

The electrode 200 may also include an insulating layer 240 located on the body 210 and terminal 220 opposite the conductive coating 230, as shown in FIG. 2. The insulating layer 240 may be a paper or non-conductive polyester film material, such as Kapton® or Mylar® as supplied by DuPont of Wilmington, Del., and may be applied by lamination.

Figure 4:
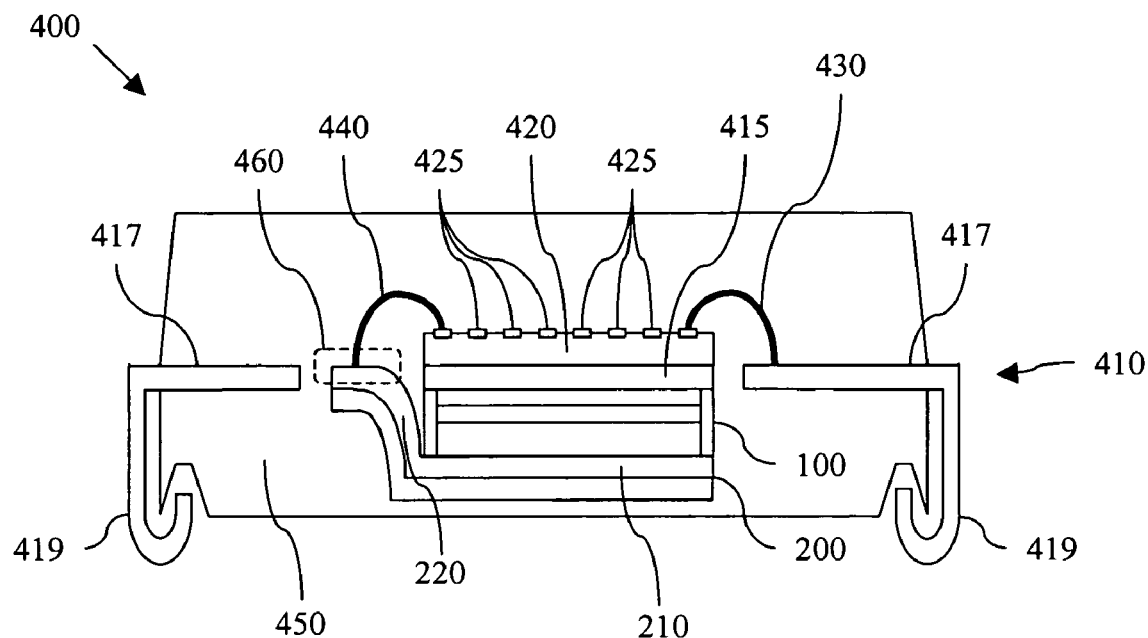
FIG. 4 is a sectional view of one embodiment of an integrated circuit package constructed according to aspects of the present disclosure.

Referring to FIG. 4, illustrated is a sectional view of an integrated circuit package (ICP) 400 constructed according to aspects of the present disclosure. The ICP 400 is one environment in which the power cell 100 shown in FIG. 1 and/or the electrode 200 shown in FIGS. 2 and 3 may be implemented. The ICP 400 includes a lead frame assembly 410, which in one embodiment is a conventional lead frame assembly having an industry-standard geometry and composition. The lead frame assembly 410 includes a central support member 415 and a plurality of formable, flexible metal leads 417 that extend radially around the periphery of the central support member 415 to a plurality of "J" pin connectors 419. In one embodiment, the lead frame assembly 410 may include 28 pairs of leads 417 and connectors 419, such as the Olin Brass C194 distributed by A.J. Oster Company of Warwick, R.I. The central support member 415 may also include a conductive coating on one or both major surfaces thereof to increase their electrical conductivity. The conductive coating may be similar to the conductive coating 230 formed on the electrode 200 described above.

The power cell 100 is coupled to a first major surface of the central support member 415, and the electrode 200 is coupled to the power cell 100 opposite the central support member 415. Of course, power sources other than or in addition to the power cell 100 may be employed within the scope of the present disclosure. An integrated circuit die 420 having input/output bond pads 425 is coupled to a second major surface of the central support member 415 opposite the power cell 100. The sub-assembly of the electrode 200, the power cell 110, the central support member 415 and the die 420 may be assembled as described above by employing adhesive layers (not shown), which may comprise an electrically and/or thermally conductive elastic dry film or a selectively deposited silicone elastomer, possibly including a silver pigmentation. The sub-assembly, or components thereof, may also be welded together by laser welding or other conventional processes. Once assembled, the electrode 200 and the central support member 415 operate as the electrodes of the power cell 100.

The ICP 400 also includes a plurality of first wire bonds 430 coupling ones of the leads 417 to ones of the bond pads 425 on the integrated circuit die 420. The first wire bonds 430 may be employed to communicate analog conditioning and sensing signals, micro-electromechanical sensing and activation signals and digital input/output signals, such as chip select, addressing or data signals. A second wire bond 440 couples one of the bond pads 425 to the electrode 200, as described below. The wire bonds 430, 440 may comprise gold or other conductive materials.

As previously mentioned, the terminal 220 of the electrode 200 allows a terminus of the second wire bond 440 to be positioned at a desired location. For example, in one embodiment, the terminus of the second wire bond 440 coupled to the terminal 220 may be positioned a perpendicular distance from the body 210 of the electrode, wherein the distance is not substantially less than the sum of the thickness of the body 210 and the power cell 100. In another embodiment, the terminal 220 may provide a wire bond contact area 460 that is proximate and substantially coplanar with the central support member 415 of the lead frame assembly 410. The terminal 220 may also be configured to position the terminus of the second wire bond 440 in a reference plane that is substantially coincident with the surface interface between the central support member 415 and the integrated circuit die 420.

By positioning the contact area 460 of the terminal 220 as discussed above, the electrode 200 may be easily connected to the appropriate bond bad 425 on the integrated circuit die 420. Consequently, the second wire bond 440 may have a similar shape and span to those of the first wire bonds 430, such that conventional wire bonding processes may be employed to interconnect the power cell 100 and the integrated circuit die 420.

In contrast, previous integration of solid state, laminated power cells into industry standard lead frame assemblies and integrated circuit packages proved to be complex and labor intensive, often requiring additional laminated layers wrapped around the power cell, or requiring excessively long wire bond lengths spanning the entire height of the integrated circuit die, lead frame assembly and power cell. However, by employing the electrode 200 (or similar embodiments within the scope of the present disclosure), the wire bond 440 interconnecting the power cell 100 and the integrated circuit die 420 may be positioned to match the planarity of the central support member 415, such that the contact area 460 of the terminal 220 may be horizontally and vertically aligned with the central support member 415. Moreover, the contact area 460 may be laterally positioned to align with a selected one of the bond pads 425 and/or with an opening between the leads 417 and the central support member 415. Such positioning also allows existing wire bond procedures to be employed to interconnect the power cell 100. Moreover, employing the electrode 220 as the bottom electrode of the power cell 100 may permit an improved power cell design, such as the embodiment shown in FIG. 1, whereby the power cell 100 may have fewer components and be smaller than existing integrated power cells.

As also shown in FIG. 4, one or more insulating layers 450 may be formed around a substantial portion of the ICP 400. For example, the insulating layers 450 may encapsulate the electrode 200, the power cell 100, the central support member 415, the integrated circuit die 420 and the wire bonds 430, 440, thereby protecting the power cell 100, the integrated circuit die 420 and their associated interconnects from potentially hazardous mechanical and environmental elements which may cause damage or destruction.

For example, in one embodiment, the partially completed ICP 400 is placed in a multi-cavity split mold, and the mold is placed in a transfer molding device. Thereafter, polyphenolene sulfide and/or another non-conductive encapsulant material is injected into the mold in pellet form. Under the appropriate temperature and pressure conditions, the pellets melt and flow into channels within the mold to fill cavities around the lead frame assembly 410, the laminated power cell 100, the electrode 200, the die 420 and the wire bonds 430, 440. The encapsulant material is cured while still in the mold by applying heat and pressure. Additional curing may take place in adjacent manufacturing processes once the ICP 400 is removed from the mold. If necessary, the ICP 400 may then be completed by conventional manufacturing processes.

Figure 5:
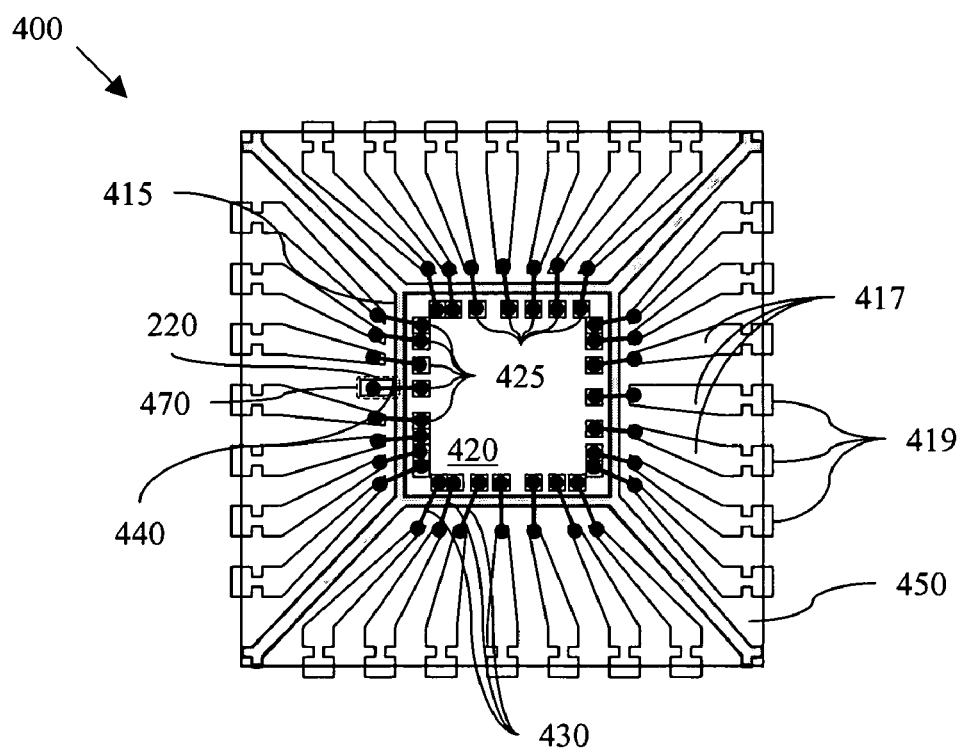
FIG. 5 is a plan view of the integrated circuit package shown in FIG. 4.

Referring to FIG. 5, illustrated is a plan view of the ICP 400 shown in FIG. 4. As shown in FIG. 5, the integrated circuit die 420 is positioned central to the plurality of leads 417, which are each coupled to an integrated circuit bond pad 425 by one of the first wire bonds 430. FIG. 5 also illustrates how the terminal 220 of the electrode 200 may be positioned proximate one of the bond pads 425, such that the second wire bond 440 may be formed by means similar to those employed to form the first wire bonds 430, including by conventional wire bonding processes.

Although the present invention has been described with reference to a specific embodiment, with reference to a logic device which utilizes particular solid state battery chemistry, the previous description is not intended to be construed in a limiting sense focused on a single application. Various modifications of the disclosed solid state battery and integrated circuit packaging process as well as alternative applications thereof will be suggest to persons skilled in the art by the foregoing specification and illustrations. It is therefore contemplated that the appended claims will cover any such modifications or embodiments.

The invention claimed is:

1. An integrated circuit package, comprising:
 a lead frame assembly including a central support member and a plurality of conductive leads, wherein the central support member has opposing first and second major surfaces, and wherein the plurality of conductive leads are radially disposed about the periphery of the central support member;
 an integrated circuit die coupled to the first surface of the central support member and having a plurality of bond pads;
 a power cell coupled to the second surface of the central support member and comprising a cathode layer, an anode layer, and a separator layer interposing the cathode and anode layers, wherein the cathode layer is doped with a first impurity type and the anode layer is doped with a second, opposite impurity type, wherein the first and second impurity types are selected from an n-type impurity and a p-type impurity, wherein the cathode layer includes manganese dioxide doped with the first impurity type, wherein the separator layer includes lithium perchlorate, and wherein the anode layer includes lithium doped with the second impurity type;
 an electrode including a planar body and a terminal extending from the body, wherein the body is coupled to the power cell opposite the central support member;
 a plurality of first wire bonds each coupling one of the plurality of bond pads and one of the plurality of conductive leads; and
 a second wire bond having a first terminus coupled to one of the plurality of bond pads and a second terminus coupled to the tenninal of the electrode, wherein the terminal has an arcuate shape configured to position the second terminus of the second wire bond in a reference plane that is coincident with the first surface of the central support member.

2. The package of claim 1 further comprising a laminated insulating layer substantially covering surfaces of the body and the terminal that are opposite the power cell.

3. The package of claim 2 wherein the insulating layer comprises one of a paper material and a polyester film material.

4. The package of claim 1 wherein the body and the terminal each comprise at least one of copper and nickel.

5. The package of claim 1 further comprising an electrical conduction enhancement material coating at least a portion of the electrode, wherein the electrical conduction enhancement material comprises graphite.

6. The package of claim 5 wherein the electrical conduction enhancement material is one of a graphite based, air-curable material and a graphite based, heat-curable material.

7. The package of claim 1 further comprising an insulating layer encapsulating the central support member, the integrated circuit die, the power cell, the electrode, the plurality of first wire bonds, and the second wire bond, collectively.

8. The package of claim 1 wherein the power cell further comprises a frame adjacent and extending along the perimeter of each of the cathode layer, the anode layer, and the separator layer, wherein the frame substantially comprises an insulating material.

9. The package of claim 1 wherein the power cell further comprises a frame adjacent and extending along the perimeter of each of the cathode layer, the anode layer, and the separator layer, wherein the frame is open at opposing first and second ends, the first end exposing the anode layer, and the second end exposing the cathode layer.

10. An integrated circuit package, comprising:
 a conventional lead frame having an industry-standard geometry and composition and including:
  a central support member;
  a plurality of formable, flexible metal leads that extend radially around the periphery of the central support member to a plurality of connectors; and
  a conductive coating located on the central support member;
 a laminated, solid polymer, rechargeable power cell having a thickness ranging between about 500 microns and about 1000 microns, the power cell including a plurality of laminated layers and a four-sided, open-ended carrier structure surrounding the plurality of laminated layers, wherein the plurality of laminated layers includes:
  a cathode layer impregnated with conductivity-enhancing impurities and having a thickness ranging between about 300 microns and about 750 microns;
  an anode layer comprising a lithium-impregnated metal and having a thickness ranging between about 30 microns and about 100 microns; and
  a solid electrolyte separator interposing the cathode layer and the anode layer and comprising lithium perchlorate and polyvinylidene ($LiClO_4$-PVDF);
  wherein a first one of the cathode layer and the anode layer is coupled to a first major surface of the central support member;
 an integrated circuit die having a plurality of bond pads and coupled to a second major surface of the central support member opposite the power cell;
 an electrode including:
  a substantially planar body having a thickness ranging between about 500 microns and about 1000 microns, a width ranging between about 7,500 microns and about 10,000 microns, and a length ranging between about 7,500 microns and about 10,000 microns, wherein a second one of the cathode layer and the anode layer is coupled to the body;
  a terminal integral to the body;
  a conductive coating located on a first side of the body and a first side of the terminal; and
  an insulating layer located on a second side of the body and a second side of the terminal, wherein the second side of the body is opposite the first side of the body, and wherein the second side of the terminal is opposite the first side of the terminal;
 a plurality of first wire bonds coupling ones of the leads to corresponding ones of the plurality of bond pads;
 a second wire bond coupling one of the plurality of bond pads to the terminal, whereby an arcuate shape of the terminal positions a terminus of the second wire bond in a reference plane that is substantially coincident with a surface interface between the central support member and the integrated circuit die; and
 an insulating layer encapsulating the electrode, the power cell, the central support member, the integrated circuit die, the plurality of first wire bonds, and the second wire bond.

* * * * *

UNITED STATES PATENT AND TRADEMARK OFFICE
CERTIFICATE OF CORRECTION

| | |
|---|---|
| PATENT NO. | : 7,230,321 B2 |
| APPLICATION NO. | : 10/685825 |
| DATED | : June 12, 2007 |
| INVENTOR(S) | : Joseph Harry McCain et al. |

Page 1 of 1

It is certified that error appears in the above-identified patent and that said Letters Patent is hereby corrected as shown below:

Column 8, line 60 claim 1, change "tenninal" to --terminal--

Signed and Sealed this

Fifth Day of August, 2008

JON W. DUDAS
*Director of the United States Patent and Trademark Office*